United States Patent
Suzuki

(10) Patent No.: US 8,675,370 B2
(45) Date of Patent: Mar. 18, 2014

(54) HEAT SOURCE UNIT

(75) Inventor: Hideaki Suzuki, Fuji (JP)

(73) Assignee: Toshiba Carrier Corporation, Tokyo (JP)

( * ) Notice: Subject to any disclaimer, the term of this patent is extended or adjusted under 35 U.S.C. 154(b) by 187 days.

(21) Appl. No.: 13/404,571

(22) Filed: Feb. 24, 2012

(65) Prior Publication Data

US 2012/0218731 A1 Aug. 30, 2012

(30) Foreign Application Priority Data

Feb. 28, 2011 (JP) ................. 2011-042823

(51) Int. Cl.
 *H05K 7/14* (2006.01)
(52) U.S. Cl.
 USPC .......................................... 361/796; 361/730
(58) Field of Classification Search
 USPC ............ 62/262, 280, 285; 361/728–730, 752, 361/796, 800, 807, 809, 810; 351/155, 156
 See application file for complete search history.

(56) References Cited

U.S. PATENT DOCUMENTS

| | | | |
|---|---|---|---|
| 6,701,738 B2 * | 3/2004 | Kobayashi et al. | 62/262 |
| 7,398,654 B2 * | 7/2008 | Choi et al. | 62/285 |
| 7,876,574 B2 * | 1/2011 | Takeichi et al. | 361/796 |
| 8,074,013 B2 * | 12/2011 | Huang et al. | 711/103 |

FOREIGN PATENT DOCUMENTS

| | | |
|---|---|---|
| JP | 2005-098625 | 4/2005 |
| JP | 4373167 | 9/2009 |

OTHER PUBLICATIONS

English Language Abstract of JP 2005-098625 published Apr. 14, 2005.
English Language Translation of JP 2005-098625 published Apr. 14, 2005.
English Language Translation of JP 4373167 published Sep. 11, 2009.

* cited by examiner

*Primary Examiner* — Hung S Bui
(74) *Attorney, Agent, or Firm* — DLA Piper LLP (US)

(57) ABSTRACT

According to one embodiment, a heat source unit apparatus includes an electric component box that is disposed in a housing, a power supply cable and a communication cable being inserted into the electric component box from an outside of the housing, a metallic electric cable cover member that is interposed between the electric component box and the housing, a power supply cable hole and a communication cable hole being made in one side surface of the housing, the power supply cable and the communication cable being covered with a cable cover member, and a partition plate that is provided in the cable cover member to partition the electric cable cover member into a region where the power supply cable is accommodated and a region where the communication cable is accommodated.

1 Claim, 5 Drawing Sheets

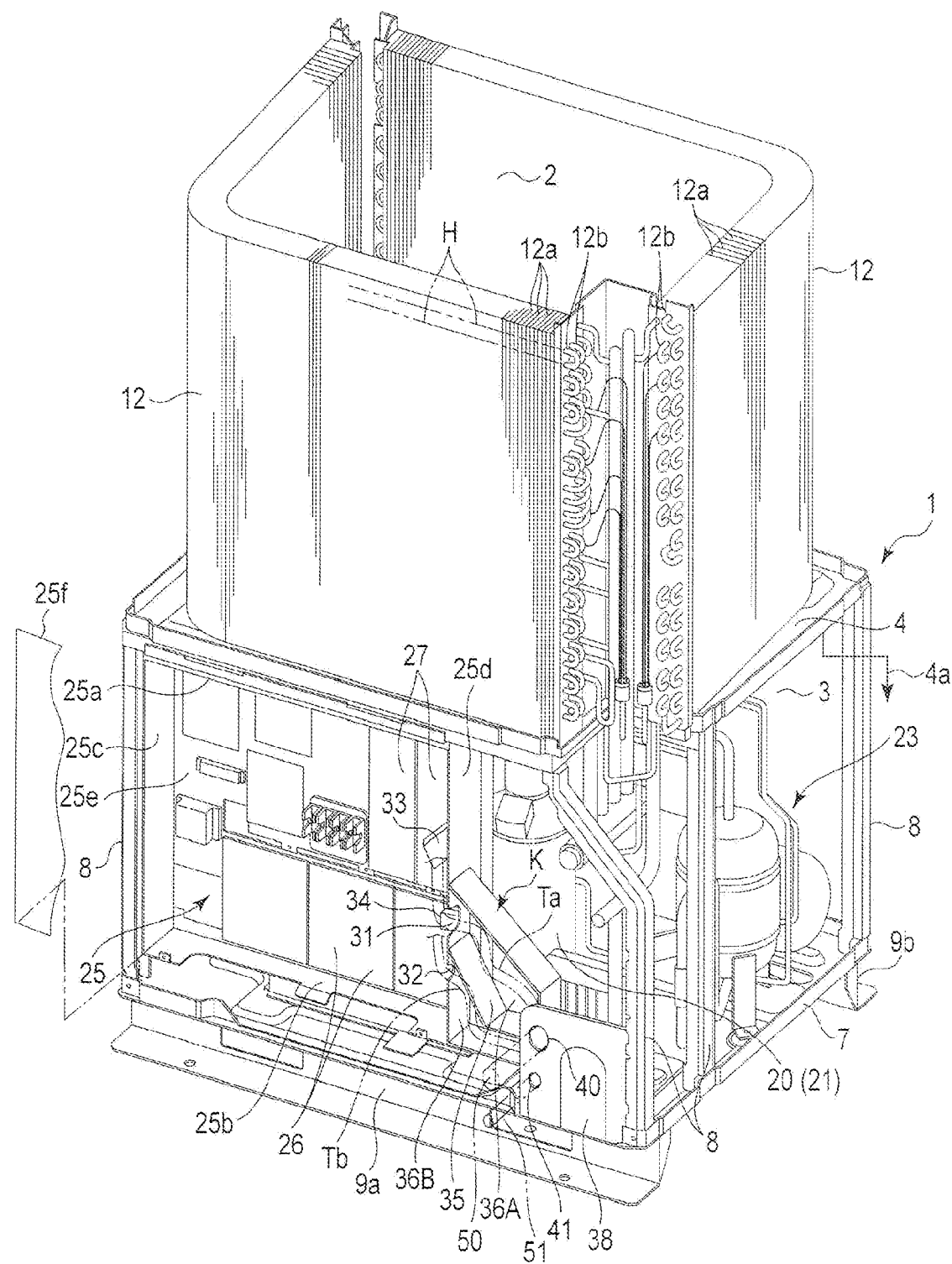
F I G. 2

HEAT SOURCE UNIT

CROSS-REFERENCE TO RELATED APPLICATIONS

This application is based upon and claims the benefit of priority from prior Japanese Patent Application No. 2011-042823, filed Feb. 28, 2011, the entire contents of which are incorporated herein by reference.

FIELD

An embodiment of the present invention relates to a heat source unit such as a multi type air conditioner, a chilling unit, and a heat pump water heater.

BACKGROUND

In the heat source unit, for example, an outdoor unit of the multi type air conditioner includes an electric component box in a housing. Electric components and electronic components are accommodated in the electric component box. The electric components drive and control motor-driven components such as a compressor and a blower. The electronic components receive signals from various sensors and a display, and transmit control signals.

For example, a heat source unit in which a wiring window is provided in a lower portion of a side panel of a unit body (housing) and the electric component box is provided near the wiring window in the unit body is well known. A notch is provided in the electric component box, an electric wiring is inserted into the wiring window from the outside of the unit body, and the electric wiring extends into the electric component box through the notch.

The electric wiring includes a power supply cable and a communication cable. The power supply cable is connected to the electric component through a terminal plate, and the communication cable is connected to the electronic component through another terminal plate. Particularly, the power supply cable and the communication cable, which are inserted into the unit body from the outside of the unit body through the wiring window, are separately and temporarily placed on a bottom plate of the wired unit body and then wired.

Then, the power supply cable and the communication cable extend to a neighborhood of the electric component box, rise along a side surface of the electric component box, and are inserted into the electric component box through the notch. Although the notches are separately provided for the power supply cable and the communication cable, sometimes the power supply cable and the communication cable come into contact with each other in the lead up to the notch from the wiring window. Therefore, noise generated from the power supply cable might affect the communication cable to cause a malfunction of a device.

Therefore, there is a demand for a heat source unit, in which the contact between the power supply cable and the communication cable is surely avoided in the lead up to the electric component box from the housing and the malfunction of the device can be prevented such that the noise generated from the power supply cable does not affect the communication cable.

BRIEF DESCRIPTION OF THE DRAWINGS

FIG. 2 is a perspective view of a state in which a housing of the outdoor unit is omitted;

DETAILED DESCRIPTION

A heat source unit according to an embodiment that includes a housing in which a power supply cable hole is made in one side surface thereof; a communication cable hole that is made in a region near the power supply cable hole in the housing; an electric component box that is disposed in the housing, a power supply cable being inserted into the electric component box from an outside of the housing through the power supply cable hole, a communication cable being inserted into the electric component box from the outside of the housing through the communication cable hole, the power supply cable and the communication cable being connected to components accommodated in the electric component box; a metallic electric cable cover member that is interposed between an outer surface of the electric component box and one side surface of the housing, the power supply cable hole and the communication cable hole being made in one side surface of the housing, the power supply cable and the communication cable being covered with the electric cable cover member; and a partition plate that is provided in the electric cable cover member to partition the electric cable cover member into a region where the power supply cable is accommodated and a region where the communication cable is accommodated.

Hereinafter, an embodiment will be described with reference to the drawings.

Figure 1:
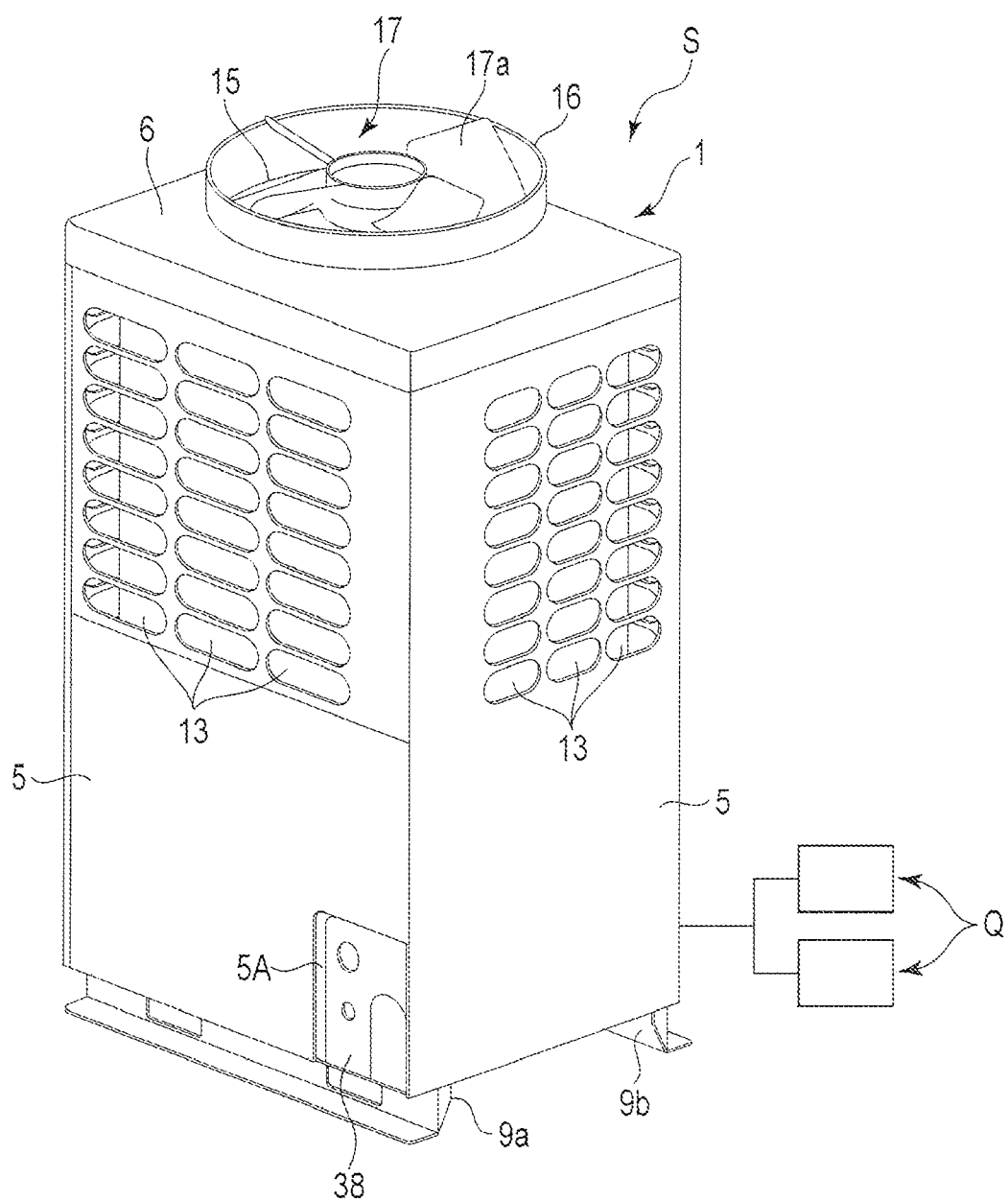
FIG. 1 is a perspective view of an appearance of an outdoor unit which is of a heat source unit according to an embodiment and constitutes an air conditioner.

FIG. 1 is a perspective view of an appearance of an outdoor unit S that constitutes an air conditioner that is of an assembled heat source unit, and FIG. 2 is a perspective view illustrating an inside of the outdoor unit S while a side panel constituting a housing 1 is detached.

Examples of the heat source unit include a chilling unit, a heat pump water heater, and an outdoor unit of an air conditioner. In the embodiment, the outdoor unit of the air conditioner will be described by way of example.

The air conditioner includes an outdoor unit S and plural indoor units Q that are connected to the outdoor unit S through refrigerant pipes and electric wirings. In the outdoor unit S, a heat exchange chamber 2 is formed on an upper side of a housing 1, and a machine chamber 3 is formed on a lower side. The heat exchange chamber 2 and the machine chamber 3 are partitioned by a horizontal partition plate 4.

Outer peripheral surfaces of the heat exchange chamber 2 and machine chamber 3 are surrounded by plural side panels 5, and an upper surface of the heat exchange chamber 2 is closed by a covered, flat, square-tube-shaped top plate 6. A bottom plate 7 made of a relatively-thick, rectangular flat steel plate is provided in a bottom of the machine chamber 3, and plural supports 8 made of L-shape steels are vertically provided on corner portions of the bottom plate 7.

L-shape installation legs 9a and 9b are integrally provided over lower end portions on both sides of the support 8 while the lower end portions face each other. The horizontal partition plate 4 is rigidly attached to top portions of the supports 8. Accordingly, the supports 8, the side panels 5, the top plate 6, and the bottom plate 7 constitute the housing 1, and the inside of the housing 1 is partitioned into upper and lower chambers by the horizontal partition plate 4.

An outdoor heat exchanger 12 is placed on the horizontal partition plate 4 in the heat exchange chamber 2, and the horizontal partition plate 4 receives drain water that is produced by the outdoor heat exchanger 12 in association with refrigeration cycle running. That is, the horizontal partition plate 4 is also used as a drain tray, and the drain water received by the horizontal partition plate 4 is drained to the outside of the housing 1 through a drain hose 4a.

The outdoor heat exchanger 12 includes a pair of heat exchangers that are formed in substantially obtuse L-shapes when viewed from above. Each heat exchanger 12 includes plural heat exchange fins 12a that are provided at predetermined intervals, plural linear heat exchange pipes H that pierce the fins, and plural U-bends 12b that sequentially connect outer end portions of the linear heat exchange pipes H to form a meandering refrigerant path.

The heat exchanger 12 is bent into the substantially obtuse L-shape when viewed from above, whereby the side panels 5 are disposed so as to surround the outside of the heat exchanger 12. In each side panel 5, plural suction ports 13 each of which includes a hole are provided opposite each side of the heat exchanger 12. The outside and inside of the heat exchange chamber 2 are communicated by the suction ports 13.

A circular air outlet 15 is provided in a substantially central portion of the top plate 6, and a cylindrical bellmouth 16 is integrally projected coaxially with the air outlet 15. A fan 17a constituting an outdoor blower 17 is provided in the bellmouth 16.

In the machine chamber 3, two compressors, 20 and 21 and an accumulator are disposed on the bottom plate 7 constituting the bottom, and pieces of piping, a piping connection member 23, and an electric component box 25 are accommodated. The pieces of piping include refrigerant piping that connects the compressors 20 and 21 and the accumulator and an oil equalizing pipe. The piping connection member 23 includes a piping connection valve (packed valve) that is connected to refrigerant piping of the indoor unit Q.

Next, the electric component box 25 will be described in detail with reference to FIGS. 2 to 4.

As described above, FIG. 2 is a perspective view illustrating the inside of the housing 1 while the side panels 5 constituting the housing 1 of the outdoor unit S are detached. However, FIG. 2 illustrates, in a simplified manner, the inside of the electric component box 25. FIG. 3 is a perspective view of a neighborhood of the electric component box 25 while the side panel 5 is detached, and FIG. 4 is a side view of the electric component box 25.

The electric component box 25 has a box shape including upper and lower, right and left surface plates 25a, 25b, 25c, and 25d and a rear plate 25e. In the electric component box 25, a front surface is opened, and the front opening is closed by a front plate 25f. That is, as illustrated in FIGS. 2 to 4, the inside of the electric component box 25 is exposed by detaching the side panels 5 constituting the housing 1 and the front plate.

Figure 3:
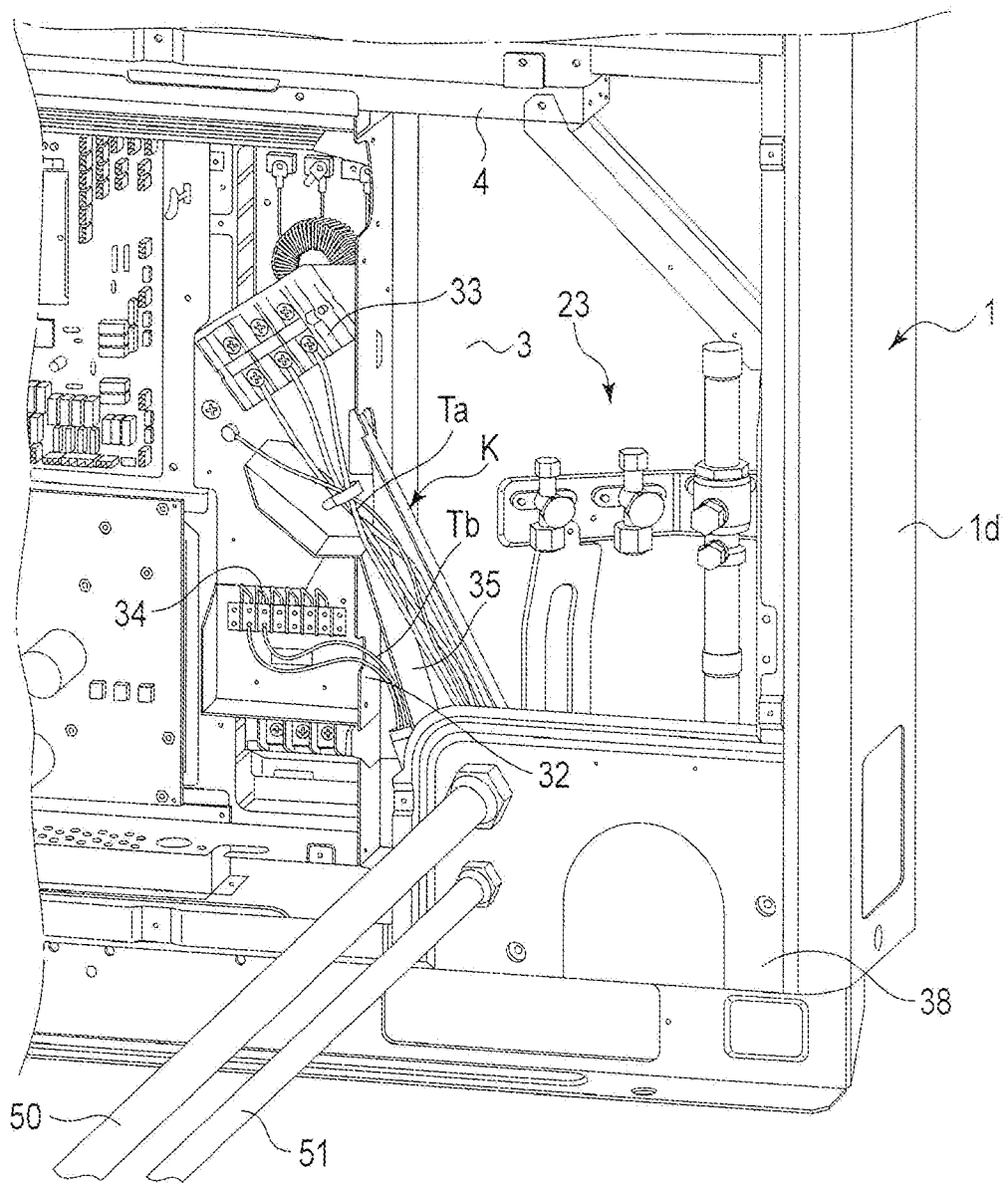
FIG. 3 is a perspective view of a main part from which a side panel of the outdoor unit is detached.

As illustrated in FIGS. 2 and 3, the left surface plate 25c of the electric component box 25 is substantially in close contact with a left side portion 1c of the housing 1, and the right surface plate 25d of the electric component box 25 is disposed while a gap is interposed between a right side portion 1d of the housing 1 and right surface plate 25d. The piping connection member 23 and an electric cable cover member K are disposed in the gap between the right surface plate 25d of the electric component box 25 and the right side portion 1d of the housing 1.

The lower surface plate 25b (bottom) of the electric component box 25 is placed on the bottom plate 7 constituting the housing 1, and the upper surface plate 25a of the electric component box 25 is substantially in contact with the horizontal partition plate 4. As illustrated in FIG. 4, a size (depth size) from a front end portion of the electric component box 25 to the rear plate 25e is extremely small compared with the depth size of the housing 1.

For example, an inverter 26 that controls the numbers of rotations of the compressors 20 and 21 and a control board 27, on which the electric components such as a controller and the electronic components that control sensors and a display by transmitting and receiving electric signals to and from the sensors and the display are mounted, are accommodated in the electric component box 25 having the above outer shape and size.

A heat sink is attached to the inverter 26 to radiate heat therefrom, and the heat sink is projected from the rear plate 25e of the electric component box 25. A duct body 29 is attached to the rear plate 25e of the electric component box 25 so as to cover the heat sink.

A duct inlet is provided in the bottom plate 7 in order to take in external air, and is connected to the duct body 29. On the other hand, a duct exhaust port is opened in the horizontal partition plate 4. An upwardly-projected projection is provided along a periphery of the duct exhaust port to prevent invasion of the drain water accumulated in the horizontal partition plate 4.

In the horizontal partition plate 4, the duct exhaust port is connected to an upper end opening of the duct body 29, and the duct exhaust port and the upper end opening of the duct body 29 constitute a cooling duct R. That is, a lower end opening of the cooling duct R is connected to the duct inlet of the bottom plate 7, the upper end opening is connected to the duct exhaust port of the horizontal partition plate 4, and the outside of the bottom plate 7 and the heat exchange chamber 2 are communicated with each other through the cooling duct R.

Figure 4:
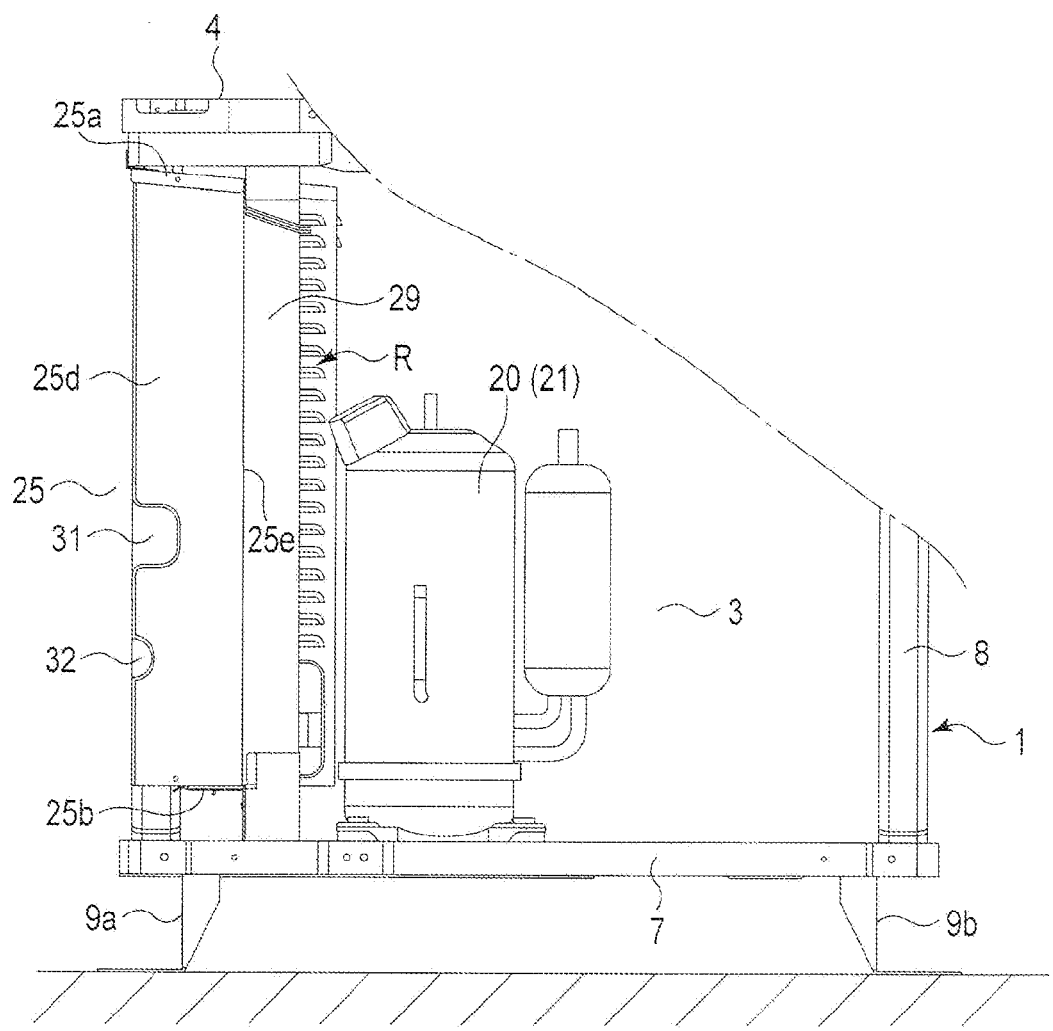
FIG. 4 is a side view of the main part from which the side panel of the outdoor unit is detached.

As illustrated in FIGS. 2 and 4, two notches, 31 and 32 are provided in a right side plate of the electric component box 25 while vertically separated from each other. The first notch 31 on the upper side is notched into a substantial U-shape from a side end edge of the right side plate, and the second notch 32 on the lower side is notched into a substantially semicircular shape. An opening area of the first notch 31 is formed larger than an opening area of the second notch 32.

On the other hand, in the electric component box 25, a first terminal plate 33 is attached to a region, which is located near the right surface plate 25d and slightly above the first notch 31, in order to distribute an electric power to the electric components. A second terminal plate 34 is attached to a region, which is located below the first terminal plate 33 and slightly above the second notch 32, in order to distribute the electric power to the electronic components.

The electric cable cover member K is attached onto the outer surface side of the right surface plate 25d of the electric component box 25 so as to cover the first notch 31 and the second notch 32.

The electric cable cover member K will be described below.

Figure 5:
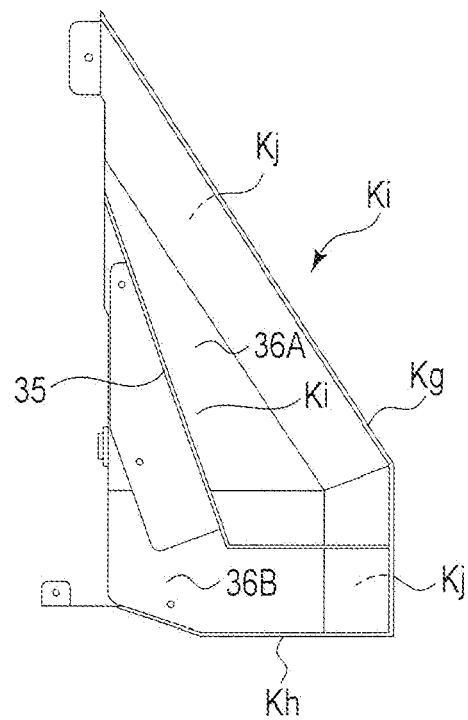
FIG. 5 is a front view of an electric cable cover member incorporated in the outdoor unit.
Figure 6:
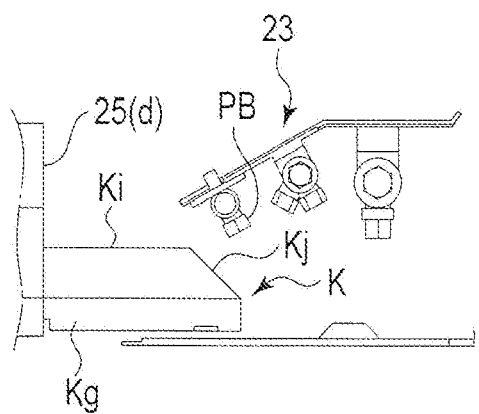
FIG. 6 is a plan view illustrating a configuration of dispositions of the electric cable cover member and a piping connection member.

Although FIGS. 2 and 3 also illustrate the electric cable cover member K, FIG. 5 is a front view of the single electric cable cover member K, and FIG. 6 is a plan view illustrating the electric component box 25 and a periphery thereof when the electric cable cover member K is attached to the electric component box 25.

The electric cable cover member K is formed by bending a metallic plate material. In the electric cable cover member K, a front surface and a left side surface are opened when the electric cable cover member K is viewed from the front side. The electric cable cover member K includes a right side portion plate Kg that is of a coupling surface of an inclined surface and a perpendicular surface, a lower plate Kh, and a rear plate Ki. Particularly, an upper end portion of the right side portion plate Kg is matched with an upper end of the left side surface, the right side portion plate Kg is formed into a relatively steep inclination from the upper end portion, and the right side portion plate Kg is bent into the perpendicular surface at a predetermined region.

In the rear plate Ki, a portion along the right side portion plate Kg constitutes an inclination portion Kj that is inclined inward as illustrated in FIG. 6, thereby preventing the electric cable cover member K from coming into contact with the packed valve PB in the piping connection member 23 that is disposed nearby.

The inside of the electric cable cover member K is partitioned by a partition plate 35 as illustrated in FIGS. 2 and 5. That is, a front end of the partition plate 35 is located in the same position as the front end opening of the electric cable cover member K, and a tailing end is connected to the rear plate Ki.

An upper end of the partition plate 35 is located in the opening of the left side portion and below the upper end of the right side portion plate Kg with a gap and inclined downward. An inclination angle of the partition place 35 is formed steeper than an inclination angle of the right side portion plate Kg.

A gap exists between an inclined lower end portion of the partition plate 35 and the lower plate Kh constituting the electric cable cover member K. The inclined lower end portion of the partition plate 35 is bent in parallel to the lower plate Kh, and the inclined lower end portion is connected to the perpendicular surface of the right side portion plate Kg while extending to the perpendicular surface. Accordingly, the partition plate 35 partitions the inside of the electric cable cover member K into an upper chamber 36A and a lower chamber 36B.

As illustrated in FIGS. 2 and 3, an attaching position is selected in the electric cable cover member K attached to the right surface plate 25d of the electric component box 25. That is, it is necessary that an opening of the left side portion in the upper chamber 36A of the electric cable cover member K faces the first notch 31 of the electric component box 25 while an opening of the left side portion in the lower chamber 36B faces the second notch 32.

As illustrated in FIG. 1, in one of the side panels 5 constituting the housing 1, a rectangular opening 5A is formed in a corner portion at a lower end, and a wiring plate 38 is vertically provided opposite the opening 5A.

In the wiring plate 38 that is also illustrated in FIGS. 2 and 3, two holes, 40 and 41 are made, vertically separated from each other. The upper hole constitutes a power supply cable hole 40, the lower hole constitutes a communication cable hole 41, and a diameter of the power supply cable hole 40 is formed larger than a diameter of the communication cable hole 41.

The lower end portion of the electric cable cover member K faces the rear surface side of the wiring plate 38. More particularly, the electric cable cover member K is partitioned into the upper chamber 36A and the lower chamber 36B by the partition plate 35, the lower end portion of the upper chamber 36A faces the power supply cable hole 40, and the lower end portion of the lower chamber 36B faces the communication cable hole 41.

End portions of a power supply cable conduit pipe 50 and a communication cable conduit pipe 51 are fixed from the outside of the housing 1 to the power supply cable hole 40 and the communication cable hole 41 to communicate the conduit pipes 50 and 51 and the inside of the housing 1. A power supply cable Ta and a communication cable Tb are inserted into the conduit pipes 50 and 51.

That is, in the above disposition and configuration, the power supply cable Ta and the communication cable Tb are inserted into the power supply cable conduit pipe 50 and the communication cable conduit pipe 51. A leading end of the power supply cable Ta is inserted into the power supply cable hole 40 made in the wiring plate 38, and a leading end of the communication cable Tb is inserted into the communication cable hole 41.

The power supply cable Ta is inserted into the upper chamber 36A of the electric cable cover member K, which is located opposite the power supply cable hole 40. The communication cable Tb is inserted into the lower chamber 36B of the electric cable cover member K, which is located opposite the communication cable hole 41.

The power supply cable Ta and the communication cable Tb extend along the inclination from the lower ends toward the upper ends of the upper chamber 36A and lower chamber 36B. Then, the power supply cable Ta goes out from the upper chamber 36A and passes through the first notch 31 provided in the electric component box 25, and the power supply cable Ta is connected to the first terminal plate 33 provided in the electric component box 25 after a coating of the leading end is removed.

The communication cable Tb goes out from the lower chamber 36B and passes through the second notch 32 provided in the electric component box 25, and the communication cable Tb is connected to the second terminal plate 34 provided in the electric component box 25 after a coating of the leading end is removed.

As described above, the first terminal plate 33 is attached in order to distribute the electric power to the electric components, and the second terminal plate 34 is attached in order to distribute the electric power to the electronic components. Therefore, the power supply cable Ta is electrically connected to the electric components, and the communication cable Tb is electrically connected to the electronic components.

In the electric cable cover member K, the power supply cable Ta is accommodated in the upper chamber 36A, and the communication cable Tb is accommodated in the lower chamber 36B. Because the partition plate 35 is interposed between the power supply cable Ta and the communication cable Tb, the power supply cable Ta and the communication cable Tb are separated from each other and hardly come into contact with each other due to the electric cable cover member K interposed between the inside of the housing 1 and the electric component box 25.

In the outdoor unit of the air conditioner having the above configuration, when a running instruction signal is input, at least one of the compressors 20 and 21 is driven to introduce a refrigerant to the outdoor heat exchanger 12, a gas-liquid separator, and an indoor heat exchanger of the indoor unit, thereby performing refrigeration cycle running.

At the same time, the outdoor blower 17 is driven to suck the external air into the heat exchange chamber 2. The external air undergoes heat exchange while passing through the outdoor heat exchanger 12, and the external air is exhausted to the outside through the outdoor blower 17. The pressure in the heat exchange chamber 2 becomes negative due to the blowing action of the outdoor blower 17, and the negative pressure of the heat exchange chamber 2 affects the cooling duct R communicated with the heat exchange chamber 2, thus the pressure in the cooling duct R also becomes negative.

Accordingly, the external air outside of the bottom plate 7 is sucked from the duct inlet, and the external air flows through the cooling duct R and leads out from the duct exhaust port to the heat exchange chamber 2. The external air comes into contact with the heat sink while flowing through the cooling duct R, and the heat transferred to the heat sink is radiated to the external air flowing through the cooling duct R, thereby cooling the inverter 26.

On the other hand, the electric cable cover member K is disposed in the housing 1, the inside of the electric cable cover member K is partitioned by the partition plate 35, the power supply cable Ta is inserted into the upper chamber 36A, and the communication cable Tb is inserted into the lower chamber 36B. Because of the structural shape of the upper chamber 36A, the large-diameter power supply cable Ta is substantially linearly drawn from the power supply cable hole 40 to the first terminal plate 33, and a stress such as bending is not applied to the power supply cable Ta.

The power supply cable Ta and the communication cable Tb are accommodated in the electric cable cover member K while separated from each other. Because the electric cable cover member K is made of the metallic plate material, the electric cable cover member K surely protects the power supply cable Ta and the communication cable Tb against an external shock. The electric cable cover member K protects the communication cable Tb against the noise generated from the power supply cable Ta, and surely prevents the malfunction of the device due to the generation of signal interference.

In the publicly known heat source unit described above, the notch provided in the left side surface of the electric component box is exposed to the inside of the housing. Accordingly, in the case that rainwater enters the housing from the suction port 13 provided in the side panel due to strong rain and wind, the rainwater might enter the electric component box from the notch.

In order to avoid this state, entry of the rainwater is prevented by filling a gap between the notch and the electric wiring with a fire-resistant material. Therefore, although the production man-hours are increased, which affects the cost, an electrical leakage accident caused by water leakage is not generated. On the other hand, in the embodiment, because the notches 31 and 32 are covered with the electric cable cover member K, entry of rainwater is prevented, to decrease the man-hours.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A heat source unit comprising:
   a housing in which a power supply cable hole is made in one side surface thereof;
   a communication cable hole that is made in a region near the power supply cable hole in the housing;
   an electric component box that is disposed in the housing, a power supply cable being inserted into the electric component box from an outside of the housing through the power supply cable hole, a communication cable being inserted into the electric component box from the outside of the housing through the communication cable hole, the power supply cable and the communication cable being connected to components accommodated in the electric component box;
   a metallic electric cable cover member that is interposed between an outer surface of the electric component box and one side surface of the housing, the power supply cable hole and the communication cable hole being made in one side surface of the housing, the power supply cable and the communication cable being covered with the electric cable cover member; and
   a partition plate that is provided in the electric cable cover member to partition the electric cable cover member into a region where the power supply cable is accommodated and a region where the communication cable is accommodated.

* * * * *